United States Patent
Olore et al.

(10) Patent No.: US 7,370,762 B2
(45) Date of Patent: May 13, 2008

(54) TRAY FOR BATCHING, STORING AND TRANSPORTING SMALL PARTS, ESPECIALLY TOOLS AND METHOD FOR USING IT

(75) Inventors: Paul Olore, Agawam, MA (US); Crai Braconnier, Agawam, MA (US)

(73) Assignee: Oerlikon Trading AG, Trubbach, Truabbach (CH)

( * ) Notice: Subject to any disclaimer, the term of this patent is extended or adjusted under 35 U.S.C. 154(b) by 345 days.

(21) Appl. No.: 10/896,621

(22) Filed: Jul. 21, 2004

(65) Prior Publication Data

US 2005/0056565 A1   Mar. 17, 2005

Related U.S. Application Data

(60) Provisional application No. 60/488,972, filed on Jul. 21, 2003.

(51) Int. Cl.
*B65D 6/04* (2006.01)

(52) U.S. Cl. .................................. 206/565; 206/526

(58) Field of Classification Search ............ 206/303, 206/454, 557–565, 373, 493, 509, 526, 372; 211/49.1; 294/5.5; 401/35; 414/287, 288, 414/795.5, 795.6, 795.9, 796.2, 935, 936

See application file for complete search history.

(56) References Cited

U.S. PATENT DOCUMENTS

| | | | | |
|---|---|---|---|---|
| 4,093,070 A | * | 6/1978 | Stahl | 206/507 |
| 4,752,146 A | * | 6/1988 | Buckle | 206/303 |
| 5,163,580 A | * | 11/1992 | Beach et al. | 206/493 |
| 5,597,073 A | * | 1/1997 | Kocis | 206/564 |
| 5,632,374 A | * | 5/1997 | Fitzsimmons et al. | 206/564 |
| 6,116,416 A | * | 9/2000 | Hansen et al. | 206/303 |
| 6,230,891 B1 | * | 5/2001 | Usui et al. | 206/454 |

FOREIGN PATENT DOCUMENTS

| | | |
|---|---|---|
| JP | 04-000372 | 1/1992 |
| JP | 29000-141108 | 5/2000 |

\* cited by examiner

*Primary Examiner*—Luan K Bui
(74) *Attorney, Agent, or Firm*—Pearne & Gordon LLP

(57) ABSTRACT

A tray to place small parts (8,9) the parts each having a through hole (15) which makes the parts adapted to be spiked on a rod (7) for further processing or transportation. The tray (10) includes a top side; a bottom side; and support means (12) to receive the parts (8,9). The support means (12) are formed or arranged such that parts (8,9) can be placed in at least one row with the through holes (15) in a line of sight to allow simultaneous picking up of at least one row of parts by introducing the rod (7) from a side.

5 Claims, 3 Drawing Sheets

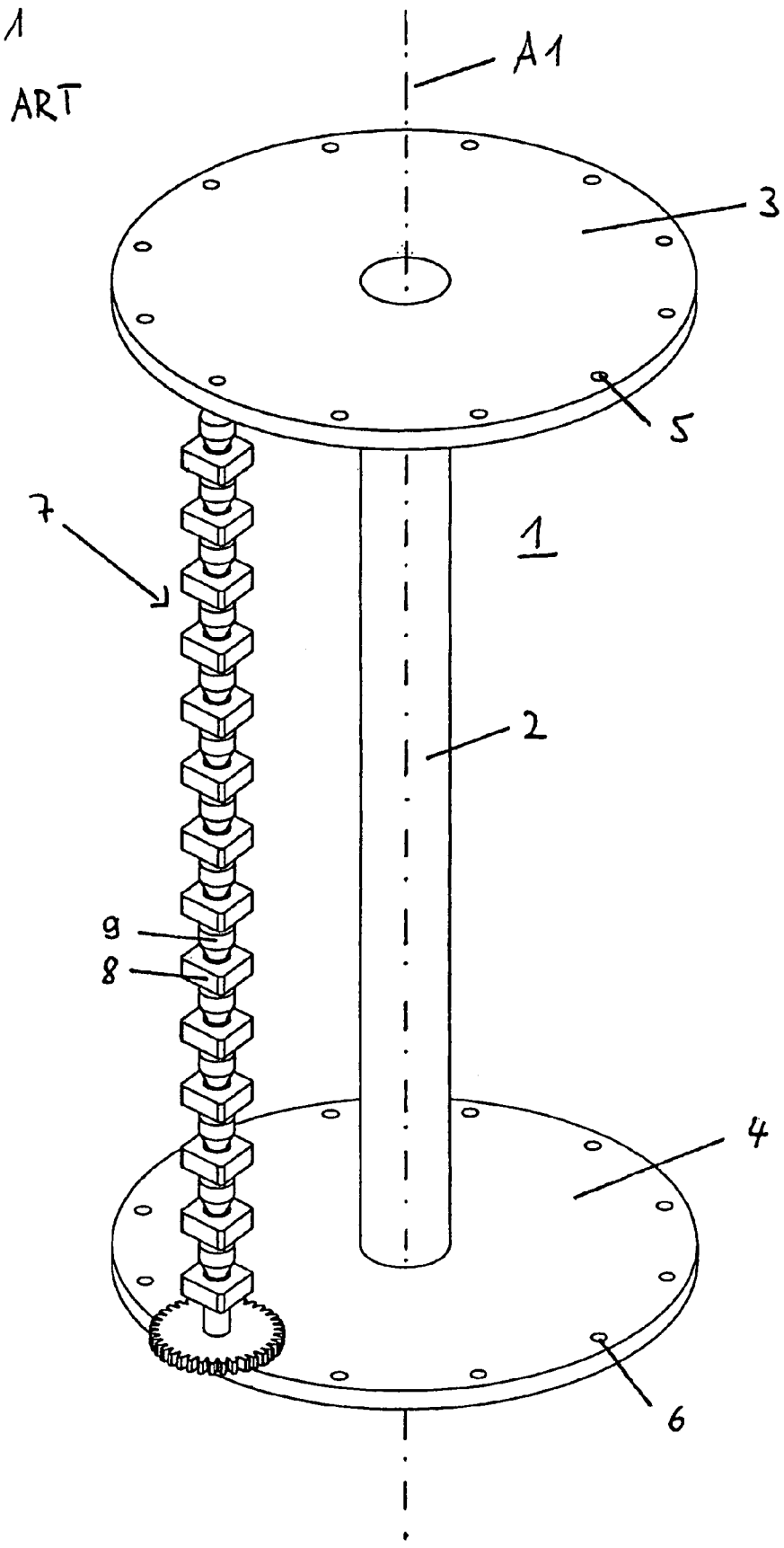

TRAY FOR BATCHING, STORING AND TRANSPORTING SMALL PARTS, ESPECIALLY TOOLS AND METHOD FOR USING IT

FIELD OF INVENTION

This invention refers to a novel type of tray as described in the claims to facilitate handling in mass production for parts having a clearance hole.

BACKGROUND OF THE INVENTION

In job coating industries many different parts with clearance holes have to be handled for coating as well as for different pre- or post treatment steps. It is known from JP04-000372A/Nippon to rotate carbide tools with a through-hole on a holding shaft during coating operations. From JP2000-141108/Hitachi it is known to provide throw away tips with a through hole to thread them on a wire with spacers between. The wire then being mounted on a jig to be rotated in a vacuum coating chamber.

Usually such inserts are packed onto a tray by a tool manufacturer and sent to a job coater where inserts are unpacked, transferred into a cleaning basket or directly on a rod, e.g. if the rod is used as mounting device for the cleaning as well as for the coating process. The rod is charged by picking up one spacer, threading it to a rod, then picking up the insert from the tray, other packaging devices or a cleaning basket and thread it onto the rod over the spacer. This process is repeated until the rod is full. The entire process is repeated until all inserts are successfully "rodded". The time required to perform this task is approximately 1 hour for 500 inserts threaded on 50 rods.

SUMMARY OF THE INVENTION

The subject of the invention is a tray to place small parts having a clearance hole which makes them adapted to be spiked on a rod, which can be too a spit, a stiff wire or the like, for further processing or transportation. The tray has a top side, a bottom side and support means to receive the parts where said support means are formed or arranged in such a way that parts can be placed in at least one row with through holes in line of sight to allow simultaneously picking up of at least one row of parts by introducing the rod from a side.

This can be done in different ways adapted to the type of parts and the type of treatment which has to be effected. For PVD or pe-CVD (plasma enhanced) processes as an example, depending on the geometry and functional needs of the coating, it may be useful to provide spacers between the small parts to avoid shadowing effects and obtain evenly coated parts. This is of special importance with cutting tools or parts for cutting tools like inserts where cutting edges have to be protected against wear on both sides.

For such parts trays can be formed or arranged in such a way that two or more types of said parts being geometrically different—like e.g. spacer and insert—can be placed alternately in at least one row.

Handling time can be reduced essentially with an inventive tray so designed that spacers and inserts are aligned properly allowing the rod to be threaded from the side of the tray, picking up the spacers and inserts without having to touch any parts. Using this method to thread 500 inserts on rods takes approximately 10 minutes only, which is an improvement of 83% compared to the example above.

It is obvious to the man of the art, that such trays can be easily tipped machine-aided by manipulators or other automation devices. The same is for rodding from the inventive trays, whereas automatic threading of rods without using such tray devices would be a comparative difficult task.

Another beneficial aspect which can be realized with such trays is to avoid manifold handling during packaging/depackaging processes during production processes. This should be illustrated by an example from the tools industry where inventive trays can be used as transportation devices between hard metal tool manufacturer, where inserts can be tipped automatically, and a job coater where rods can be quickly threaded from the trays. After coating and potential pre- and post treatment processes are accomplished inserts can be "dethreaded" on the trays and sent back the tool manufacturer. Therefor only at the beginning of the process single inserts have to be handled, with every following step a multitude of parts can be handled at once.

BRIEF DESCRIPTION OF THE DRAWINGS

FIG. 1 shows a processing device according to the invention.

DETAILED DESCRIPTION OF THE INVENTION

Figure 2B:
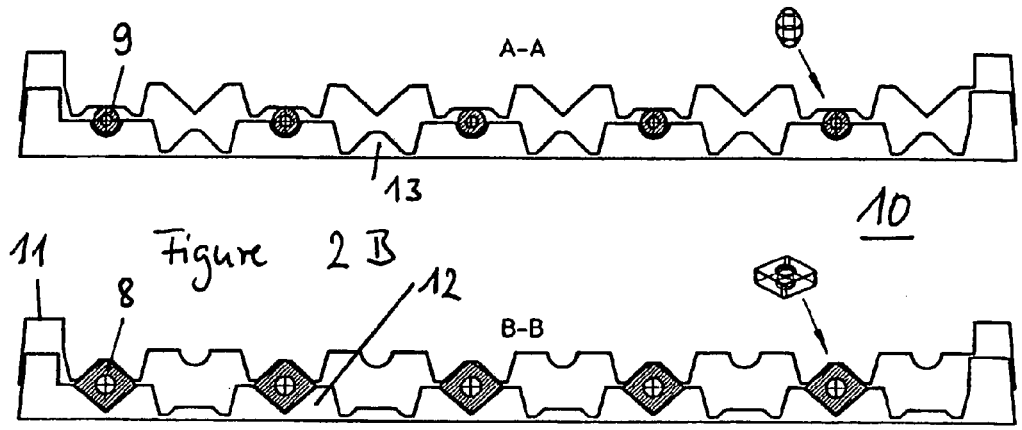
FIG. 2 shows a top view and side view of a tray according to the invention.

FIG. 1 illustrates a processing device 1 as it is used widely for PVD and pe-CVD processes to subject different parts 8, 9 to a surface treatment like etching or coating. Device 1 is rotated round a first axis A1 and comprises an upper and a lower plate 3, 4 which are mounted on a central post 2, each plate having devices 5, 6 to support and guide rod 7 with parts 8, 9. Rod 7 can be further rotated round a second axis A7 to give parts 8, 9 a twofold rotating movement during processing. Depending on the size of parts 8, 9 as well as on the size of the vacuum equipment several devices 1 can be used at the same time within one vacuum process. As an example several thousand throw away tips 8 with spacers 9 to avoid shadowing can be treated within one coating batch of a big PVD-coating equipment like a Balzers BAI 1200 machine.

Figure 2A:
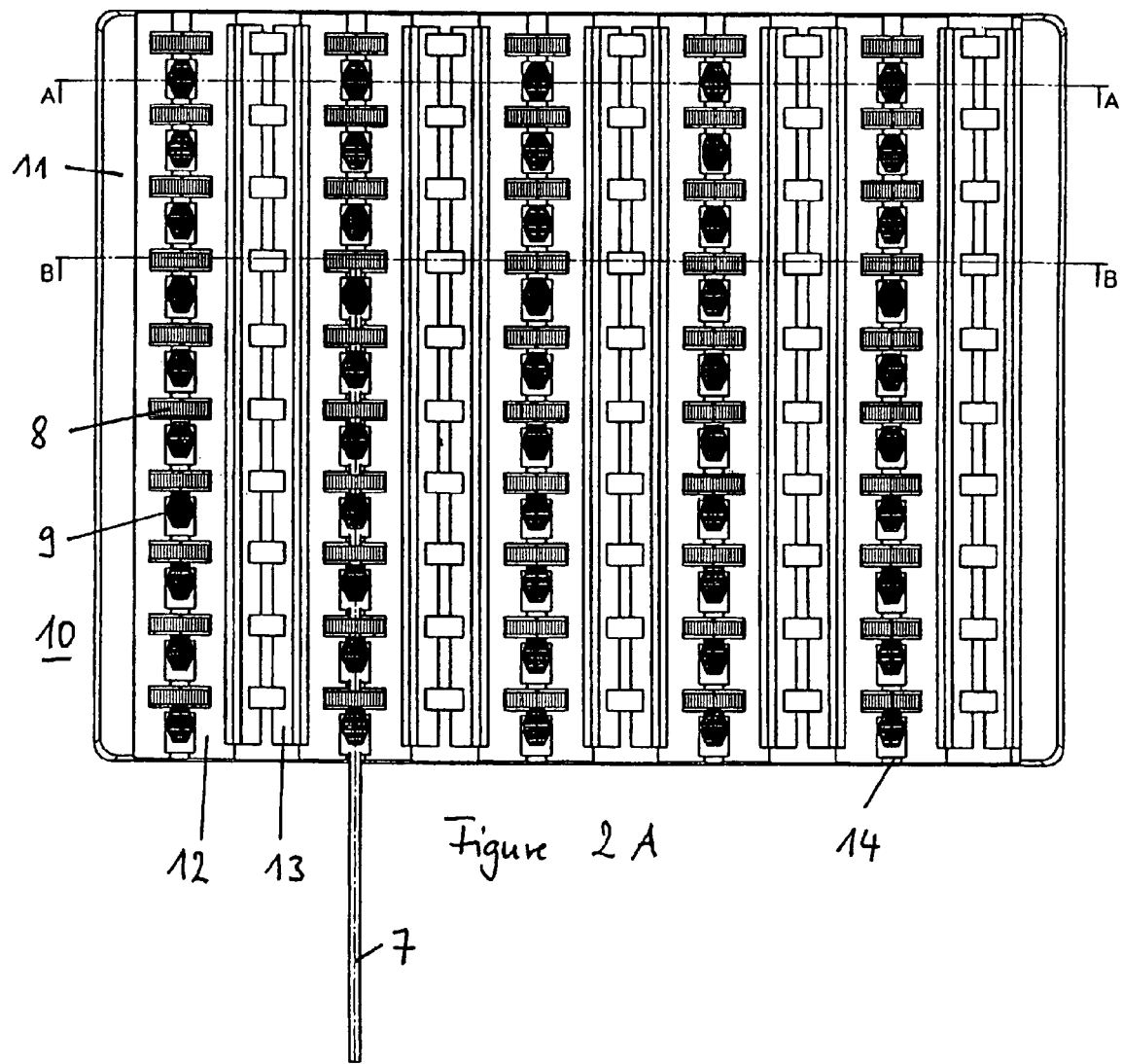
Figure 3:
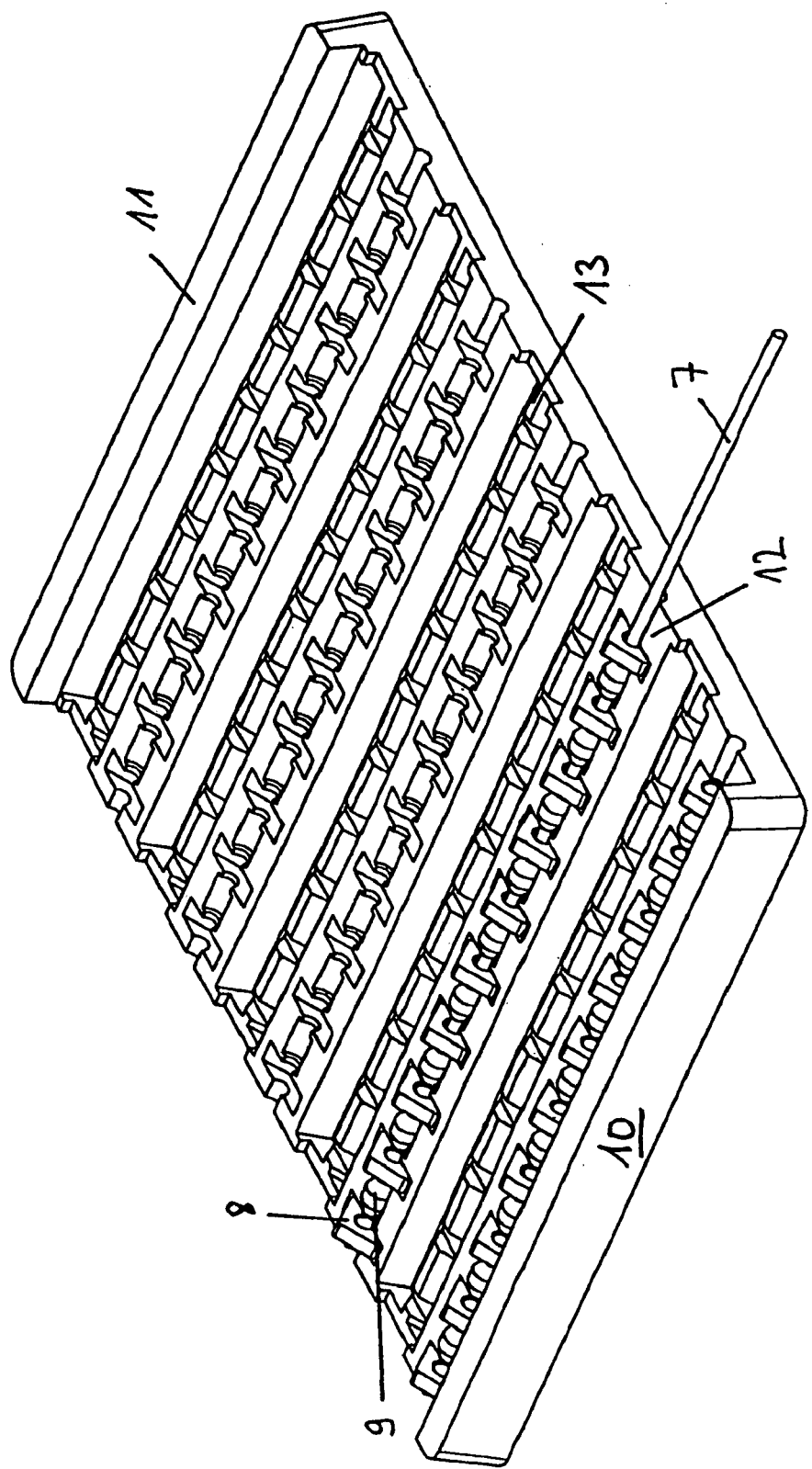
FIG. 3 shows a perspective view of a tray according to the invention.

An example of an inventive tray 10 is shown in FIG. 2, top view under 2A and side view under 2B. An embossed border 11 and tangential deviation of lateral faces form stacking means to ensure a good hold to the trays below and above. Support means 12 for parts 8, 9 are aligned in support rows, fixing means 13 are aligned in fixing rows alternating with said support rows. Additionally recesses 14 are formed at one or both front ends of every support row to facilitate access of rod 7 to clearance holes 15 of parts 8 and 9.

A perspective view of a tray is given in FIG. 9 with inserts 8 and spacers 9 placed in support row 12.

Tray types may also vary in the type of material used to answer a certain purpose of use. For transportation needs light weight materials like plastics which can be easily vacuum molded in a great variety of different shapes may be the material of choice. If trays should be used for cleaning purposes too, grid constructions made from chemical resistant plastics, stainless steel, plastified metals or the like can be used.

To enable stable piling up of one or several trays upon the other it is advisable to provide stacking means which may comprise a circumferential border adapted to sit on the border of the tray below at the same time giving hold to the next tray above. Other stacking means as an example may comprise sloped side surfaces, center holes and the like which is well known from the state of the art.

Especially for trays which are used for transportation it is important to provide fixing means. These fixing means are advantageously arranged on the bottom side of a tray in a way such that they can fix parts being placed in at least one row of support means of a tray below. At the top of a charged stack of trays an empty tray can then be placed as a cover to avoid loss of parts during transport.

That is why advantageously the inventive design should allow the tray to act as both the bottom and the top, thereby eliminating the need for two separate molds to accumulate a stack of trays. As an example of such an inventive design rows of support means are arranged alternately with an equal number of rows of fixing means in the manner of alternating rows on both sides of a tray. The first row will now be a row of support means, the last row a row of fixing means or vice versa. By simply rotating a second tray 180 degrees against a first tray filled with parts the second tray can serve to cover the first and fix parts in support means. Following trays can be used the same way to complete stack.

Despite of the fact that this type of tray has been tested successfully with different parts in mass production, it has to be emphasized that the actual invention does not only refer to trays of this type with alternating rows of support and fixing means where the upper part essentially is the negative form of the lower part, which facilitates cheap tray production by vacuum forming.

For purposes where a tight part arrangement is needed, trays with top side and bottom side of different designs can be useful e.g. tray having support rows only on the top side and fixing rows only on the bottom side.

For ease of handling in production tray types can be designed to accommodate a variety of sizes of different parts like inserts and spacers of different types.

What is claimed is:

1. A combination comprising:
   a tray comprising a top side, a bottom side and extending substantially lengthwise and widthwise along a major plane, and support means (12) to receive a plurality of parts (8,9) having different geometries and to retain said parts arranged alternately in said tray in at least one row;

a plurality of parts (8,9) having different geometries but all of them having a through hole received in said support means and arranged in a row therein, said support means structured so that the through holes of all said plurality of parts arranged in said row, despite their different geometries, are aligned so that all of their respective through holes are aligned along a common line of sight; and a rod inserted through all of the through holes of all of said parts arranged in said row, said support means, parts and through holes all being arranged and disposed so that said rod is inserted through said through holes from a side of said tray, so that when inserted through said holes said rod is essentially parallel to the major plane of said tray.

2. The tray according to claim 1, wherein said tray comprises stacking means (11) to enable stable piling up of one or several trays (1) upon the other and said tray comprises fixing means (13) to fix parts being placed in at least one row of the support means of a tray below.

3. The tray according to claim 2, wherein said support means (12) and said fixing means (13) are disposed as alternating rows on both sides of the tray (10).

4. The tray according to claim 3, wherein a first of said alternating rows is a row of the support means (12) and a last of said alternating rows is arow of the fixing means (13) so that parts (8,9) being placed in the support means (12) of the tray (10) can be fixed by fixing means (13) of a second tray having a same structure as the tray (10) when second tray has been rotated 180° in a support plane and set on top of the tray (10).

5. The tray according to claim 1, wherein the tray (10) is made from plastics.

\* \* \* \* \*